(12) United States Patent
Kim et al.

(10) Patent No.: US 7,910,931 B2
(45) Date of Patent: Mar. 22, 2011

(54) THIN FILM TRANSISTOR SUBSTRATE HAVING A CONTACT HOLE THAT DOES NOT EXPOSE A STEP PORTION

(75) Inventors: Hyuk-Jin Kim, Cheonan-si (KR); Kyung-Wook Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 11/428,980

(22) Filed: Jul. 6, 2006

(65) Prior Publication Data

US 2007/0023760 A1 Feb. 1, 2007

(30) Foreign Application Priority Data

Jul. 7, 2005 (KR) .......................... 10-2005-0061359

(51) Int. Cl.
*H01L 29/04* (2006.01)

(52) U.S. Cl. .......................................... 257/72; 438/199

(58) Field of Classification Search .................... 257/72; 438/149

See application file for complete search history.

(56) References Cited

U.S. PATENT DOCUMENTS

| 6,130,443 | A  | * | 10/2000 | Hong et al. | ...................... 257/59 |
| 7,009,206 | B2 | * | 3/2006 | Lee et al. | ......................... 257/72 |
| 2004/0238823 | A1 | * | 12/2004 | Lee et al. | ........................ 257/72 |

* cited by examiner

*Primary Examiner* — David Vu (74) *Attorney, Agent, or Firm* — H.C. Park & Associates, PLC (57) ABSTRACT

A thin film transistor substrate including a thin film transistor having a drain electrode with an electrode portion, which overlaps with a semiconductor layer, and an extended portion, which extends from the electrode portion and has a portion overlapping with a storage electrode or storage electrode line. A passivation layer is arranged on the drain electrode, and it has a contact hole that partially exposes the extended portion of the drain electrode without exposing a step in the extended portion caused by the storage electrode or storage electrode line. A pixel electrode is arranged on the passivation layer and is electrically connected with the extended portion of the drain electrode through the contact hole.

29 Claims, 8 Drawing Sheets

THIN FILM TRANSISTOR SUBSTRATE HAVING A CONTACT HOLE THAT DOES NOT EXPOSE A STEP PORTION

CROSS REFERENCE TO RELATED APPLICATION

This application claims priority from and the benefit of Korean Patent Application No. 10-2005-0061359, filed on Jul. 7, 2005, which is hereby incorporated by reference for all purposes as if fully set forth herein.

BACKGROUND OF THE INVENTION

1. Field of the Invention

The present invention relates to a thin film transistor (TFT) substrate used for a liquid crystal display apparatus, and more particularly, to a TFT substrate that may prevent faulty pixels from occurring due to permeation of cleaning liquid.

2. Discussion of the Background

Generally, a liquid crystal display (LCD) displays images using electrical and optical properties of liquid crystals that are injected into a liquid crystal panel. LCD displays have several advantages such as they may be made thin, lightweight, and they have relatively low power consumption as compared to electronic products having a cathode ray tube (CRT). Therefore, LCDs are extensively used in a variety of applications, including display devices such as laptop and desktop computers, HD imaging systems, and the like.

An LCD generally includes a liquid crystal panel assembly and a backlight assembly. The liquid crystal panel assembly may include a liquid crystal panel, a driving integrated circuit (IC), and a flexible printed circuit board. The liquid crystal panel may be formed by injecting liquid crystal material having an anisotropic dielectric constant between a TFT substrate and a color filter substrate. The driving IC applies a driving signal to a gate line and a data line formed on the liquid crystal panel. The flexible printed circuit board connects the driving IC with a printed circuit board, which transmits predetermined data and control signals to the driving IC. The liquid crystal panel assembly is combined with the backlight assembly, which includes a lamp assembly and various optical sheets, thereby forming the LCD.

Generally, the TFT substrate includes gate wiring, data wiring, and a pixel electrode. The gate wiring includes a gate line end portion, a gate line, a gate electrode, and a storage electrode line. The data wiring includes a data line end portion, a source electrode, a drain electrode, and a data line. The pixel electrode transmits a signal received through the data line to a pixel area to form an electric field in a liquid crystal layer.

The drain electrode overlaps a portion of the storage electrode line. The overlapped portion of the storage electrode line and the drain electrode forms a storage capacitor that stores a signal applied to the pixel electrode until a subsequent signal is applied.

A passivation layer may be formed on the gate wiring and the data wiring to protect them. A contact hole may be formed in the passivation layer so that a predetermined region of the drain electrode may be electrically connected with the pixel electrode. The contact hole may expose a step of the storage electrode line.

When depositing a metal material for forming the data wiring, the metal material may not be deposited on the step, thereby resulting in a crevice since the step is not favorable to the formation of a layer thereon. In particular, the step is more unfavorable to layer formation when the gate wiring and the data wiring have a multilayer structure than when they have a single-layer structure. If a crevice forms at the step, cleaning liquid may collect at the crevice when performing various cleaning processes, which may cause the data and gate wirings to erode.

Such erosion of the data wiring or the gate wiring causes a faulty pixel to occur. Accordingly, it is desired to prevent faulty pixels from occurring due to the permeation of a cleaning liquid to increase yield.

SUMMARY OF THE INVENTION

The present invention provides a thin film transistor (TFT) substrate that may be capable of preventing a faulty pixel from occurring due to permeation of a cleaning liquid.

The present invention also provides a liquid crystal display (LCD) apparatus including the TFT substrate.

Additional features of the invention will be set forth in the description which follows, and in part will be apparent from the description, or may be learned by practice of the invention.

The present invention discloses a thin film transistor substrate including a gate line having a gate electrode formed on an insulating substrate, a storage electrode line having a storage electrode formed on the same layer as the gate line, a gate insulating layer formed on the gate line, a semiconductor layer formed on the gate insulating layer, a data line crossing the gate line and having a source electrode that at least partially overlaps with the semiconductor layer, a drain electrode opposite to the source electrode with respect to the gate electrode and including an electrode portion, which overlaps with the semiconductor layer, and an extended portion, which extends from the electrode portion and has a portion that overlaps with the storage electrode, a passivation layer formed on the drain electrode and having a contact hole that partially exposes the extended portion of the drain electrode and entirely overlaps with the storage electrode, and a pixel electrode formed on the passivation layer and electrically connected with the extended portion of the drain electrode through the contact hole.

The present invention also discloses a thin film transistor substrate including a gate line having a gate electrode formed on an insulating substrate, a storage electrode line formed on the same layer as the gate line, a gate insulating layer formed on the gate line, a semiconductor layer formed on the gate insulating layer, a data line crossing the gate line and having a source electrode that at least partially overlaps with the semiconductor layer, a drain electrode opposite to the source electrode with respect to the gate electrode and including an electrode portion, which overlaps with the semiconductor layer, and an extended portion, which extends from the electrode portion and has a portion that overlaps with the storage electrode line, a passivation layer formed on the drain electrode and having a contact hole that partially exposes the extended portion of the drain electrode and does not overlap with the storage electrode line, and a pixel electrode formed on the passivation layer and electrically connected with the extended portion of the drain electrode through the contact hole.

The present invention also discloses a thin film transistor substrate including a gate line having a gate electrode formed on an insulating substrate, a storage electrode line formed on the same layer as the gate line, a gate insulating layer formed on the gate line, a semiconductor layer formed on the gate insulating layer, a data line crossing the gate line and having a source electrode that at least partially overlaps with the semiconductor layer, a drain electrode opposite to the source electrode with respect to the gate electrode and including an electrode portion, which overlaps with the semiconductor layer and the storage electrode line, and an extended portion, which extends from the electrode portion, a passivation layer formed on the drain electrode and having a contact hole that partially exposes the extended portion of the drain electrode and does not overlap with the storage electrode line, and a pixel electrode formed on the passivation layer and electrically connected with the extended portion of the drain electrode through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The present invention will now be described more fully with reference to the accompanying drawings, in which exemplary embodiments of this invention are shown.

First, a thin film transistor (TFT) substrate 2 and a liquid crystal display (LCD) apparatus 1 including the TFT substrate 2, according to a first exemplary embodiment of the present invention, will be described below with reference to FIG. 1.

Figure 1:
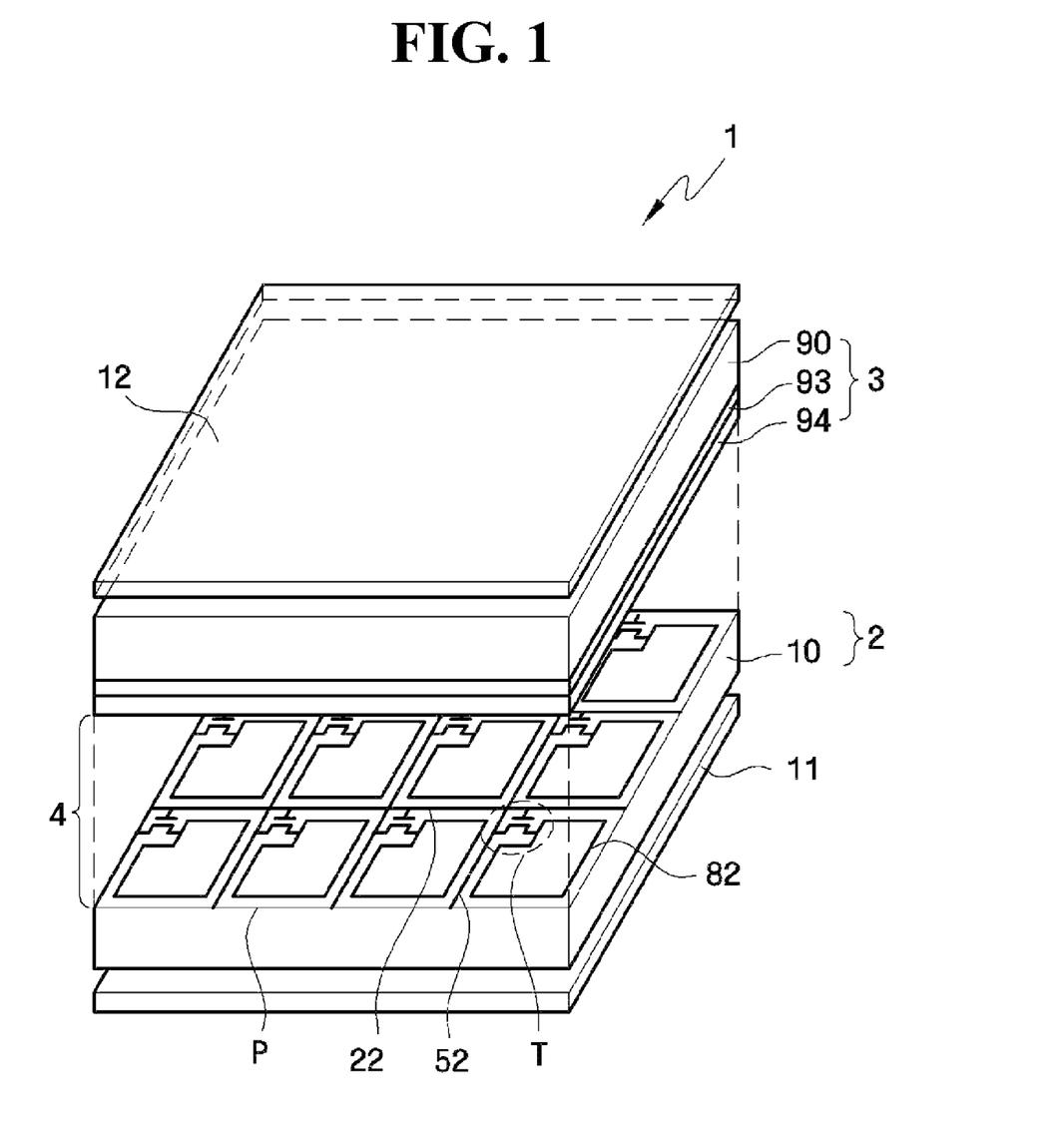
FIG. 1 is a partial perspective view of an LCD apparatus according to an exemplary embodiment of the present invention.

Referring FIG. 1, the LCD apparatus 1 includes the TFT substrate 2, a common electrode substrate 3 facing the TFT substrate 2 and separated by a predetermined distance therefrom, and a liquid crystal layer 4 interposed between the TFT substrate 2 and the common electrode substrate 3 to be aligned in a predetermined direction.

A plurality of gate lines 22 is arranged on the TFT substrate 2 in a horizontal direction, and a plurality of data lines 52 is arranged to be insulated from, and in a direction crossing, the gate lines 22. A pixel electrode 82 is formed at each pixel P formed at intersections between the gate lines 22 and the data lines 52. A TFT T is formed at each pixel P to be electrically connected with a gate line 22, a data line 52, and a pixel electrode 82. The detailed description thereof will be described below with reference to FIG. 2 and FIG. 3.

A color filter layer 93, an overcoat layer (not shown), and a common electrode 94 are sequentially formed on one side of the common electrode substrate 3. The color filter layer 93 includes a color filter that transmits light only in a particular wavelength range and a black matrix (BM) (not shown) arranged on the border of the color filter to block light in an area where the alignment of the liquid crystal layer 4 is not controlled. The overcoat layer (not shown) planarizes the color filter layer 93 and enhances adhesion between the color filter layer 93 and the common electrode 94.

A lower polarizing plate 11 and an upper polarizing plate 12, which transmit light only that is parallel with a polarization axis, are arranged outside the TFT substrate 2 and the common electrode substrate 3, respectively. A separate light source, such as a backlight (not shown), may be disposed on the bottom of the lower polarizing plate 11.

Here, the TFT substrate 2 will be described in detail below with reference to FIG. 1, FIG. 2, and FIG. 3.

Figure 2:
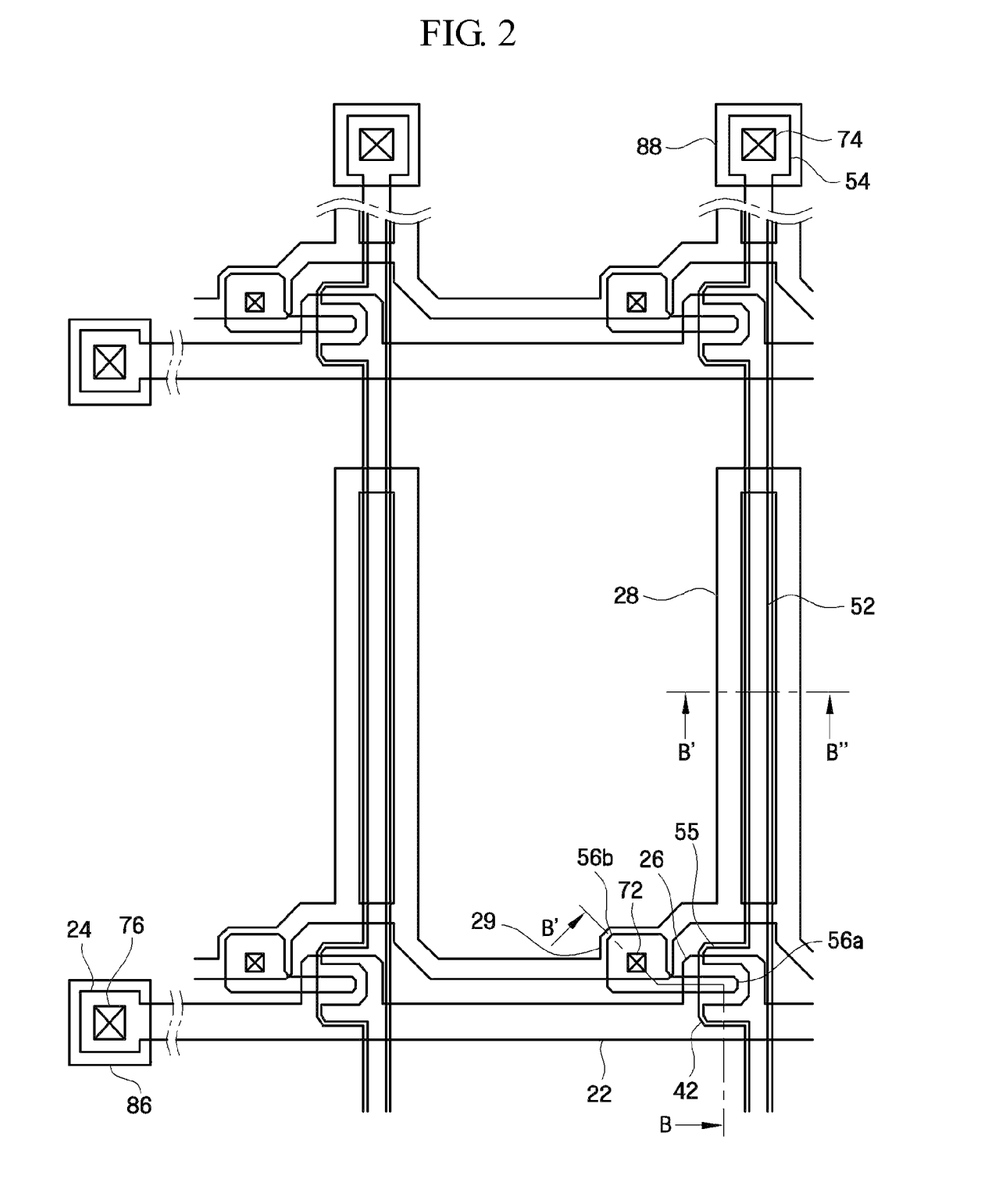
FIG. 2 is a partial layout of a TFT substrate according to a first exemplary embodiment of the present invention.
Figure 3:
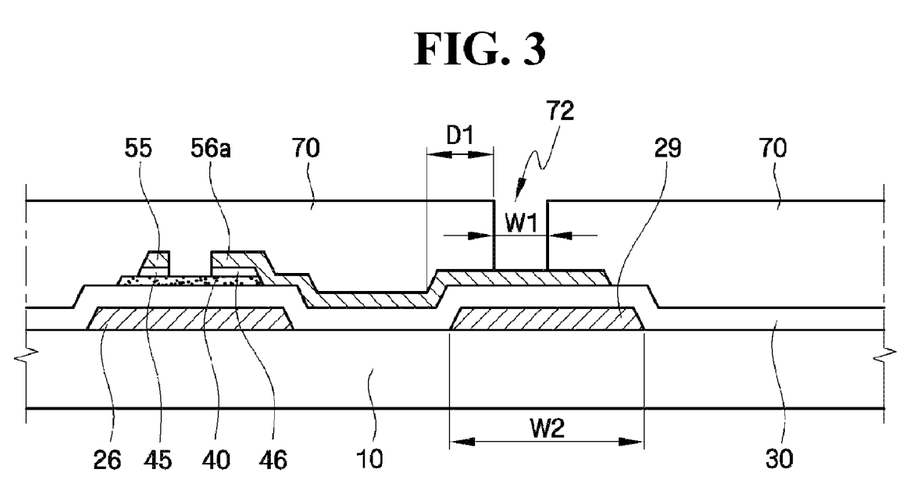
FIG. 3 is a cross section taken along line B-B' of the TFT substrate shown in FIG. 2.

FIG. 2 is a partial layout of a TFT substrate according to a first exemplary embodiment of the present invention, and FIG. 3 is a cross section taken along line B-B' of the TFT substrate shown in FIG. 2.

Referring FIG. 1, FIG. 2 and FIG. 3, the gate lines 22 are arranged on an insulating substrate 10 in the horizontal direction, and a plurality of gate electrodes 26 protrudes from each gate line 22. A gate line end portion 24 is formed at an end of the gate line 22 to receive and transmit a gate signal to the gate line 22. The gate line end portion 24 has an extended width so that it may be electrically connected with an external circuit. The gate line 22, the gate electrode 26, and the gate line end portion 24 form a gate wiring 22, 24, 26.

Additionally, a storage electrode line 28 and a storage electrode 29 are formed on the insulating substrate 10. The storage electrode line 28 extends around a pixel area. The storage electrode 29, which is wider than the storage electrode line 28, is formed at a portion of the storage electrode line 28. Here, the storage electrode 29 partially overlaps with an extended portion 56b of a drain electrode 56a, 56b, which will be described below, and may be formed to cover a contact hole 72 that partially exposes the extended portion 56b. In other words, the storage electrode 29 may be formed such that its width W2 exceeds a width W1 of the contact hole 72. In more detail, the storage electrode 29 may be formed such that a step in the extended portion 56b caused by a sidewall of the storage electrode 29 may be spaced apart from the contact hole 72 by at least a predetermined threshold value D1, e.g., 1.5 μm. In an embodiment of the present invention, the threshold value D1 is a threshold value after an etching process. The storage electrode line 28 may be initially patterned such that the sidewall of the storage electrode 29 that overlaps with the extended portion 56b of the drain electrode 56a, 56b is spaced apart from the contact hole 72 by about 2 μm because the width of the storage electrode 29 may be reduced by 0.5 μm when performing the etching process.

The storage electrode 29 may be patterned in a size including 6×8 μm or 6×6 μm.

After forming the storage electrode 29, the contact hole 72 that partially exposes the extended portion 56b of the drain electrode 56a, 56b may be formed in a passivation layer 70, which will be described below, such that the contact hole 72 entirely overlaps with the storage electrode 29, as shown in FIG. 3. In other words, the contact hole 72 does not expose a step of the storage electrode line 28. In this case, even when various cleaning processes are performed after forming the contact hole 72 in the passivation layer 70, a crevice is not formed at the step. Consequently, a cleaning liquid may be prevented from permeating and eroding the data line 52 and the gate line 22.

The storage electrode line 28 and the storage electrode 29 form storage electrode wiring. The same voltage may be applied to the common electrode 94 on the common electrode substrate 3 and the storage electrode line 28. Various modifications may be made to the shape and arrangement of the storage electrode wiring.

The gate wiring 22, 24, 26 and the storage electrode wiring 28, 29 may be made of Al, an Al alloy, Ag, an Ag alloy, Cu, a Cu alloy, Mo, a Mo alloy, Cr, Ti or Ta.

Additionally, the gate wiring 22, 24, 26 and the storage electrode wiring 28, 29 may have a multi-layered structure including two conductive films (not shown) that have different physical characteristics. One of the two films may be made of a low resistivity metal including Al, an Al alloy, Ag, an Ag alloy, Cu, and a Cu alloy for reducing signal delay or voltage drop in the gate wiring 22, 24, 26 and the storage electrode wiring 28, 29. The other film may be made of material such as Mo, a Mo alloy, Cr, Ta and Ti, which have good physical, chemical, and electrical contact characteristics with other materials such as indium tin oxide (ITO) or indium zinc oxide (IZO). Examples of combinations of the two films include a lower Cr film and an upper Al (alloy) film, and a lower Al (alloy) film and an upper Mo (alloy) film. However, the gate wiring 22, 24, 26 and the storage electrode wiring 28, 29 may be made of various metals or conductors.

A gate insulating layer 30 is formed on the gate wiring 22, 24, 26 and the storage electrode wiring 28, 29.

A semiconductor layer 40, which may be made using hydrogenated amorphous silicon or polysilicon, is formed on the gate insulating layer 30. The semiconductor layer 40 may have various shapes such as an island and a line. For example, when the semiconductor layer 40 is line shaped, it may be arranged below the data line 52 and extend to the gate electrode 26.

Ohmic contact layers 45 and 46, which may be made using a material such as silicide or n+ hydrogenated amorphous silicon doped with n-type impurities at high concentration, are formed on the semiconductor layer 40. The ohmic contact layers 45 and 46, which reduce contact resistance, are disposed between the semiconductor layer 40 and a source electrode 55 and a drain electrode 56a, 56b. The ohmic contact layers 45 and 46 may be formed in the shape of an island or line. When the ohmic contact layers 45 and 46 are line shaped, they extend below the data line 52.

The data line 52 and the drain electrode 56a, 56b are formed on the ohmic contact layers 45 and 46 and the gate insulating layer 30. The data line 52 extends in a vertical direction and crosses the gate line 22 to define a pixel.

A data line end portion 54 is formed at an end of the data line 52 to receive and transmit a data signal to the data line 52. The data line end portion 54 has an extended width so that it may be electrically connected with an external circuit.

The source electrode 55 protrudes in a U-shape from the data line 52 at intervals of a pixel length and extends above the ohmic contact layer 45. In other words, the source electrode 55 is arranged to partially cross the gate electrode 26 and the semiconductor layer 40.

The drain electrode 56a, 56b is separate from the source electrode 55 and is arranged above the ohmic contact layer 46 opposite to the source electrode 55 with respect to the gate electrode 26. The drain electrode 56 includes an electrode portion 56a, which overlaps with the gate electrode 26 and the semiconductor layer 40, and the extended portion 56b, which extends from the electrode portion 56a and overlaps with the storage electrode 29. The drain electrode's extended portion 56b overlaps with the storage electrode 29 with the gate insulating layer 30 interposed therebetween, thereby forming a storage capacitor.

The data line 52, the data line end portion 54, the source electrode 55, and the drain electrode 56a, 56b form a data wiring 52, 54, 55, 56a, 56b. The data line 52 may have various shapes. For example, the data line 52 may be formed in a straight line extending in the vertical direction, or it may be alternately formed in a curved line and vertical straight line at pixel length intervals.

Accordingly, a pixel defined by an intersection between the gate line 22 and the data line 52 may have a shape such as a quadrangular shape or a bent strip shape according to the shape of the data line 52.

Figure 8:
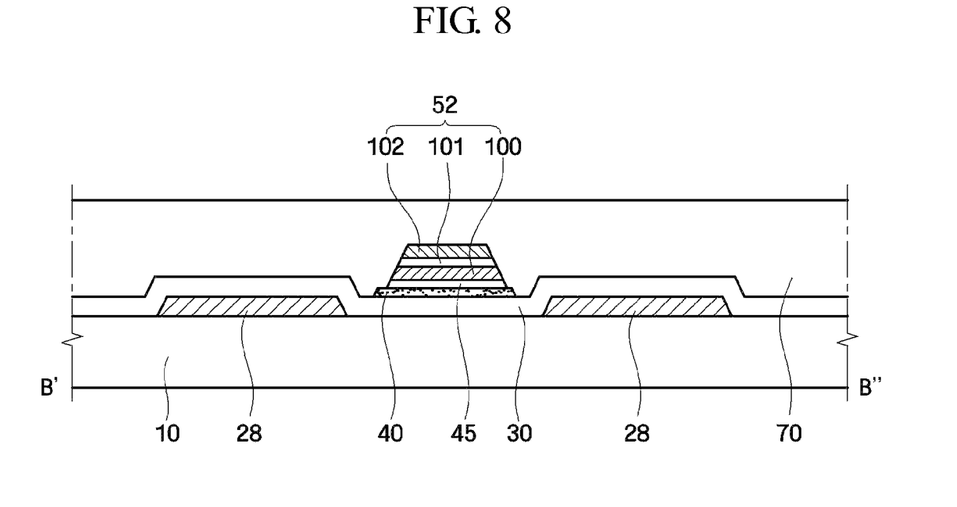
FIG. 8 is a cross section taken along line B'-B" of the TFT substrate shown in FIG. 2 according to an exemplary embodiment of the present invention.

The data line 52, the source electrode 55, and the drain electrode 56a, 56b may be made of a refractory metal such as Cr, Mo, Ti, Ta or alloys thereof. Also, the data line 52, the source electrode 55, and the drain electrode 56a, 56b may have a multilayered structure including a lower layer made of a single, refractory metal (not shown) and an overlying layer made of a low-resistivity film (not shown). Examples of the multi-layered structure include a double-layered structure of a lower Cr film and an upper Al film, a double-layered structure of a lower Al film and an upper Mo film, and as shown in FIG. 8, a triple-layered structure of a lower Mo film 100, an intermediate Al film 101, and an upper Mo film 102.

The gate electrode 26, the semiconductor layer 40, the source electrode 55, and the drain electrode 56a, 56b form the TFT T, which operates as a switching element.

The passivation layer 70, which may be made using an organic insulating layer, is disposed on the data line 52, the drain electrode 56a, 56b, and the exposed semiconductor layer 40. Here, the passivation layer 70 may be made of an inorganic insulator such as silicon nitride or silicon oxide, a photosensitive organic material having a good flatness characteristic, or a low dielectric insulating material such as a-Si: C:O and a-Si:O:F formed by plasma enhanced chemical vapor deposition (PECVD).

A contact hole 74, which exposes the data line end portion 54, and the contact hole 72, which exposes the extended portion 56b of the drain electrode 56a, 56b, are formed in the passivation layer 70. A contact hole 76, which exposes the gate line end portion 24, is formed in the passivation layer 70 and the gate insulating layer 30. The contact hole 72 may be formed within an area where the extended portion 56b of the drain electrode 56a, 56b overlaps with the storage electrode 29. More specifically, the storage electrode 29 may be formed such that a step in the extended portion 56b of the drain electrode 56*a*, 56*b* caused by a sidewall of the storage electrode 29 may be spaced apart from the contact hole 72 by at least 1.5 μm.

Additionally, a pixel electrode 82 may be formed on the passivation layer 70 along the shape of a pixel, and it may be electrically connected with the drain electrode 56*a*, 56*b* through the contact hole 72.

In addition, an auxiliary data line end portion 88 and an auxiliary gate line end portion 86, which are connected with the data line end portion 54 and the gate line end portion 24 through the contact holes 74 and 76, respectively, may be formed on the passivation layer 70. Here, the pixel electrode 82, the auxiliary gate line end portion 86, and the auxiliary data line end portion 88 may be made of a transparent conductor such as ITO or IZO or a reflective conductor such as Al. The auxiliary gate line end portion 86 and the auxiliary data line end portion 88 may enhance adhesion with the gate and data line end portions 24 and 54, respectively, and with external devices.

The pixel electrode 82 may be physically and electrically connected to the drain electrode 56*a*, 56*b* through the contact hole 72 such that the pixel electrode 82 receives the data voltage from the drain electrode 56*a*, 56*b*. Electric fields are generated between the pixel electrode 82, supplied with the data voltages, and the common electrode 94 of the common electrode substrate 3, thereby determining an orientation of liquid crystal molecules in the LC layer 4 between the pixel electrode 82 and the common electrode 94.

Figure 4:
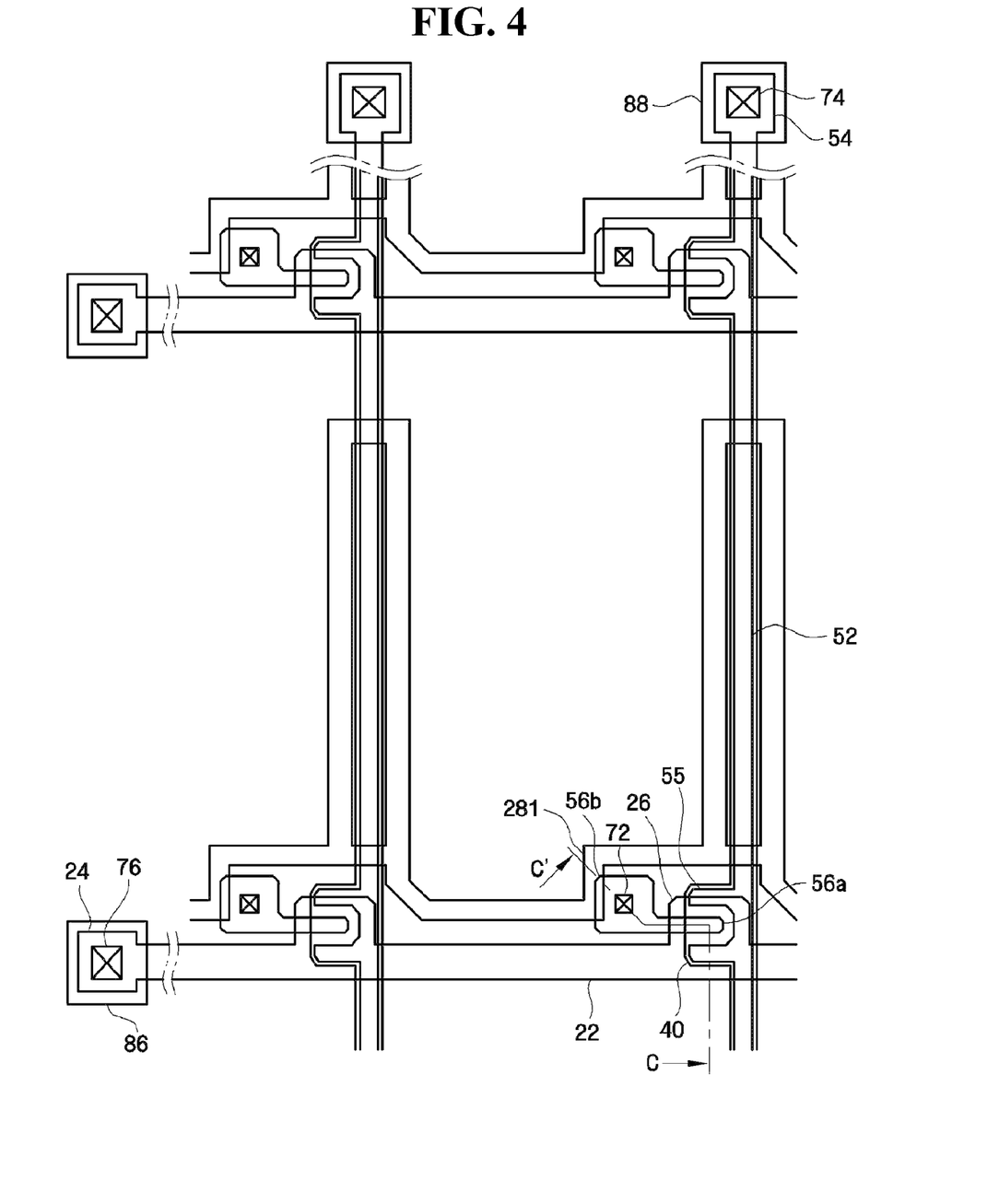
FIG. 4 is a partial layout of a TFT substrate according to a second exemplary embodiment of the present invention.
Figure 5:
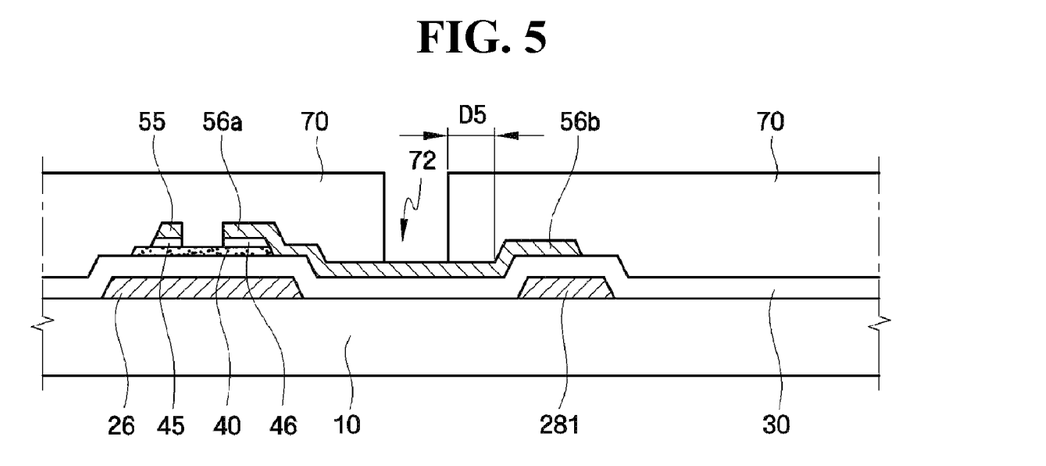
FIG. 5 is a cross section taken along line C-C' of the TFT substrate shown in FIG. 4.

A TFT substrate according a second exemplary embodiment of the present invention is described below with reference to FIG. 4 and FIG. 5. FIG. 4 is a partial layout of a TFT substrate according to a second exemplary embodiment of the present invention, and FIG. 5 is a cross section taken along line C-C' of the TFT substrate shown in FIG. 4. For the sake of clarity and ease of explanation, components having the same function in the drawings for describing the first embodiment are respectively identified by the same reference numerals, and their repetitive description is omitted.

A TFT substrate according to the second exemplary embodiment of the present invention fundamentally has the same structure as the TFT substrate 2 according to the first exemplary embodiment of the present invention, with the following exceptions. Referring to FIG. 4 and FIG. 5, a storage electrode line 281 bends in a predetermined direction along the shape of the extended portion 56*b* of the drain electrode 56*a*, 56*b*. The bent portion of the storage electrode line 281 partially overlaps with the extended portion 56*b* of the drain electrode 56*a*, 56*b* in a direction of the width of the storage electrode line 281, thereby forming a storage capacitor. Thereafter, when the contact hole 72 is formed in the passivation layer 70, it may be disposed between the electrode portion 56*a* of the drain electrode 56*a*, 56*b* and the storage electrode line 281. Here, the contact hole 72 may be separated from a step in the extended portion 56*b* caused by a sidewall of the storage electrode line 281 by at least a predetermined threshold value D5, for example, at least 1.5 μm.

After forming the storage electrode line 281, the contact hole 72, which partially exposes the extended portion 56*b* of the drain electrode 56*a*, 56*b*, may be formed in a passivation layer 70, which will be described below, such that the contact hole 72 does not overlap with the storage electrode line 281, as shown in FIG. 5. In other words, the contact hole 72 does not expose a step of the storage electrode line 281. In this situation, even when various cleaning processes are performed after forming the contact hole 72 in the passivation layer 70, a crevice is not formed at the step. As a result, cleaning liquid may be prevented from permeating and eroding the data line 52 and the gate line 22.

Figure 6:
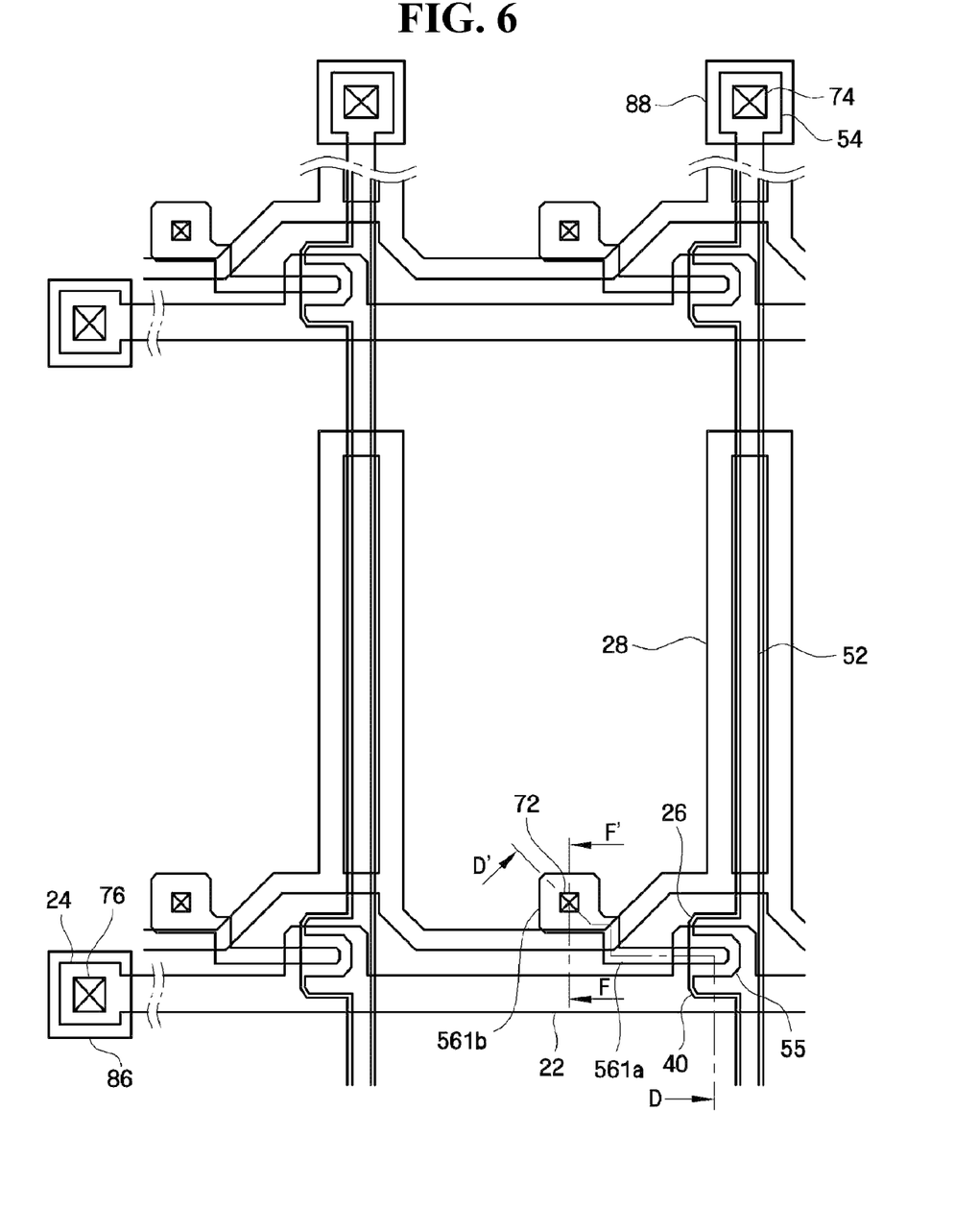
FIG. 6 is a partial layout of a TFT substrate according to a third exemplary embodiment of the present invention.
Figure 7A:
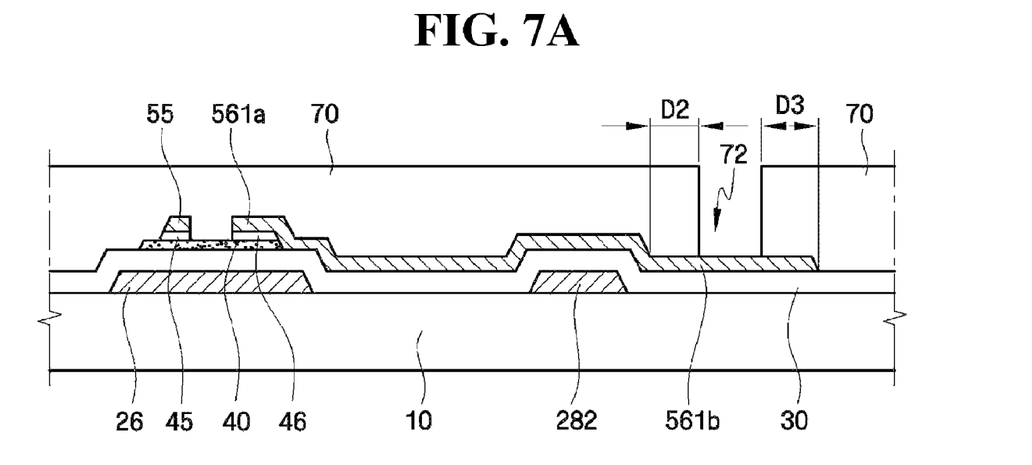
FIG. 7A is a cross section taken along line D-D' of the TFT substrate shown in FIG. 6.
Figure 7B:
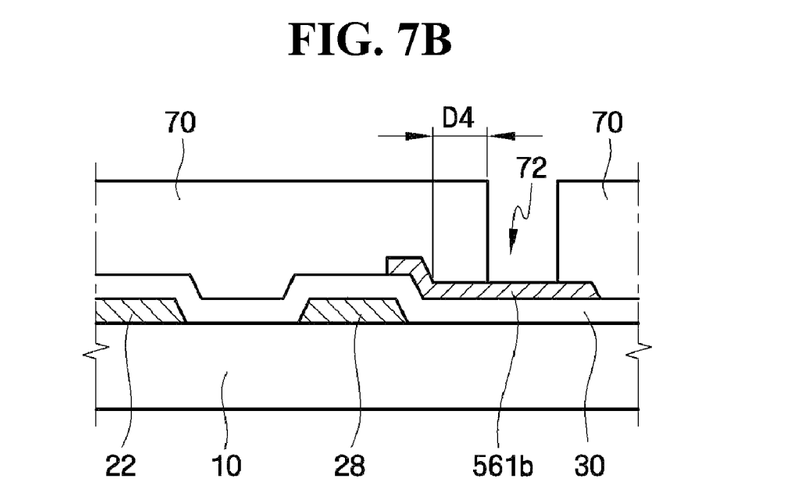
FIG. 7B is a cross section taken along line F-F' of the TFT substrate shown in FIG. 6.

The following describes a TFT substrate according a third exemplary embodiment of the present invention with reference to FIG. 6, FIG. 7A, and FIG. 7B. FIG. 6 is a partial layout of a TFT substrate according to a third exemplary embodiment of the present invention, FIG. 7A is a cross section taken along line D-D' of the TFT substrate shown in FIG. 6, and FIG. 7B is a cross section taken along line F-F' of the TFT substrate shown in FIG. 6. For the sake of clarity and ease of explanation, components having the same function in the drawings for describing the first embodiment are respectively identified by the same reference numerals, and their repetitive description is omitted.

The TFT substrate according to the third exemplary embodiment of the present invention fundamentally has the same structure as the TFT substrate 2 according to the first exemplary embodiment of the present invention, with the following exceptions. Referring to FIG. 6, FIG. 7A, and FIG. 7B, an electrode portion 561*a* of the drain electrode 561*a*, 561*b* bends in a predetermined direction such that the electrode portion 561*a* crosses over the storage electrode line 282 with the gate insulating layer 30 interposed therebetween. Here, an overlapping region between the electrode portion 561*a* and the storage electrode line 282 forms a storage capacitor.

A wide-area extended portion 561*b* extends from an end of the electrode portion 561*a* of the drain electrode 561*a*, 561*b*.

The passivation layer 70 is formed on the drain electrode 561*a*, 561*b*, the data line 52, and the exposed semiconductor layer 40. Here, the passivation layer 70 may be made of an inorganic insulator such as silicon nitride or silicon oxide, a photosensitive organic material having a good flatness characteristic, or a low dielectric insulating material such as a-Si:C:O and a-Si:O:F formed by PECVD.

The contact hole 76, which exposes the gate line end portion 24, is formed in the passivation layer 70 and the gate insulating layer 30. The contact hole 74, which exposes the data line end portion 54, and the contact hole 72, which exposes the extended portion 561*b* of the drain electrode 561*a*, 561*b*, are formed in the passivation layer 70. Here, as shown in FIG. 7A, the contact hole 72 may be spaced apart from an outer sidewall of the extended portion 561*b* by at least a predetermined threshold value D3, for example, at least 1.5 μm.

Additionally, the contact hole 72 may be spaced apart from a step in the extended portion 561*b* caused by an outer sidewall of the storage electrode line 282 by at least a predetermined threshold value D2, for example, at least 1.5 μm.

The extended portion 561*b* of the drain electrode 561*a*, 561*b* may partially overlap with the storage electrode line 282. In this case, as shown in FIG. 7B, the contact hole 72 may be spaced apart from a step in the extended portion 561*b* caused by an outer sidewall of the storage electrode line 282 by at least a predetermined threshold value D4, for example, at least 1.5 μm.

After forming the drain electrode 561*a*, 561*b*, the contact hole 72 may be formed in the passivation layer 70 such that it does not overlap with the storage electrode line 282, as shown in FIG. 7A and FIG. 7B. In other words, the contact hole 72 does not expose a step of the storage electrode line 282. In this situation, even when various cleaning processes are performed after forming the contact hole 72 in the passivation layer 70, a crevice is not formed at the step. As a result, a cleaning liquid may be prevented from permeating and eroding the data line 52 and the gate line 22.

As described above, according to exemplary embodiments of the present invention, a storage electrode is formed on a storage electrode line, or the position of the storage electrode line or a drain electrode is changed, so that a step of the storage electrode line is not exposed through a contact hole. Consequently, cleaning liquid may be prevented from permeating a data line or a gate line through a crevice formed at the step of the storage electrode line and from eroding the data or gate line. Accordingly, occurrence of faulty pixels may be prevented in a liquid crystal panel, thereby increasing LCD apparatus yield.

In concluding the detailed description, those skilled in the art will appreciate that many variations and modifications may be made to the exemplary embodiments without substantially departing from the principles of the present invention. Therefore, the disclosed exemplary embodiments of the invention are used in a generic and descriptive sense only and not for purposes of limitation.

What is claimed is:

1. A thin film transistor substrate, comprising:
   a gate line comprising a gate electrode arranged on an insulating substrate;
   a storage electrode line comprising a storage electrode arranged on the same layer as the gate line;
   a gate insulating layer arranged on the gate line;
   a semiconductor layer arranged on the gate insulating layer;
   a data line crossing the gate line and comprising a source electrode that at least partially overlaps with the semiconductor layer, a drain electrode opposing the source electrode with respect to the gate electrode and comprising an electrode portion, which overlaps with the semiconductor layer, and an extended portion, which extends from the electrode portion and has a portion that overlaps with the storage electrode;
   a passivation layer arranged on the drain electrode and comprising a contact hole that partially exposes the extended portion of the drain electrode and entirely overlaps with the storage electrode; and
   a pixel electrode arranged on the passivation layer and electrically connected with the extended portion of the drain electrode through the contact hole,
   wherein the storage electrode comprises a first portion extended along the gate line and a second portion extended along the data line,
   wherein the first portion has an expansion, and the expansion of the first portion overlaps with the contact hole.

2. The thin film transistor substrate of claim 1, wherein a step in the extended portion caused by an outer sidewall of the storage electrode is spaced apart from the contact hole by at least a predetermined threshold value.

3. The thin film transistor substrate of claim 2, wherein the predetermined threshold value is 1.5 µm.

4. The thin film transistor substrate of claim 1, wherein the data line comprises a triple layer structure.

5. The thin film transistor substrate of claim 4, wherein the triple layer structure comprises a lower aluminum layer on the semiconductor layer, an upper molybdenum layer on the lower aluminum layer, and a lower molybdenum layer arranged between the semiconductor layer and the lower aluminum layer.

6. The thin film transistor substrate of claim 4, wherein the semiconductor layer is arranged below the data line.

7. The thin film transistor substrate of claim 1, wherein the storage electrode line extends around a pixel area.

8. The thin film transistor substrate of claim 7, wherein the semiconductor layer is arranged below the data line.

9. The thin film transistor substrate of claim 1, wherein the passivation layer consists of a single contact hole in a pixel.

10. The thin film transistor substrate of claim 9, wherein a single pixel electrode is disposed in the pixel.

11. The thin film transistor substrate of claim 9, wherein a width of the extended portion is wider than a width of the electrode portion.

12. The thin film transistor substrate of claim 11, wherein the semiconductor layer is arranged below the data line.

13. The thin film transistor substrate of claim 1, wherein the data line comprises a lower aluminum layer on the semiconductor layer and an upper molybdenum layer on the lower aluminum layer.

14. The thin film transistor substrate of claim 1, wherein the semiconductor layer is arranged below the data line.

15. The thin film transistor substrate of claim 1, wherein the extended portion has an expansion, which overlaps with the storage electrode, and the contact hole overlaps with the expansion of the extended portion.

16. A thin film transistor substrate, comprising:
    a gate line comprising a gate electrode arranged on an insulating substrate;
    a storage electrode line comprising a storage electrode arranged on the same layer as the gate line;
    a gate insulating layer arranged on the gate line;
    a semiconductor layer arranged on the gate insulating layer;
    a data line crossing the gate line and comprising a source electrode that at least partially overlaps with the semiconductor layer, a drain electrode opposing the source electrode with respect to the gate electrode and comprising an electrode portion, which overlaps with the semiconductor layer, and an extended portion, which extends from the electrode portion and has a portion that overlaps with the storage electrode;
    a passivation layer arranged on the drain electrode and comprising a contact hole that partially exposes the extended portion of the drain electrode and entirely overlaps with the storage electrode; and
    a pixel electrode arranged on the passivation layer and electrically connected with the extended portion of the drain electrode through the contact hole,
    wherein the extended portion has an expansion, which overlaps with the storage electrode, and the contact hole overlaps with the expansion of the extended portion.

17. The thin film transistor substrate of claim 16, wherein a step in the extended portion caused by an outer sidewall of the storage electrode is spaced apart from the contact hole by at least a predetermined threshold value.

18. The thin film transistor substrate of claim 17, wherein the predetermined threshold value is 1.5 µm.

19. The thin film transistor substrate of claim 16, wherein the data line comprises a triple layer structure.

20. The thin film transistor substrate of claim 19, wherein the triple layer structure comprises a lower aluminum layer on the semiconductor layer, an upper molybdenum layer on the lower aluminum layer, and a lower molybdenum layer arranged between the semiconductor layer and the lower aluminum layer.

21. The thin film transistor substrate of claim 19, wherein the semiconductor layer is arranged below the data line.

22. The thin film transistor substrate of claim 16, wherein the storage electrode comprises a first portion disposed in parallel with the gate line and a second portion extending along the data line.

23. The thin film transistor substrate of claim 22, wherein the storage electrode line extends around a pixel area.

24. The thin film transistor substrate of claim 23, wherein the semiconductor layer is arranged below the data line.

25. The thin film transistor substrate of claim 16, wherein the data line comprises a lower aluminum layer on the semiconductor layer and an upper molybdenum layer on the lower aluminum layer.

26. The thin film transistor substrate of claim 16, wherein the passivation layer consists of a single contact hole in a pixel.

27. The thin film transistor substrate of claim 26, wherein a single pixel electrode is disposed in the pixel.

28. The thin film transistor substrate of claim 16, wherein the semiconductor layer is arranged below the data line.

29. The thin film transistor substrate of claim 16, wherein the storage electrode comprises a first portion extended along the gate line and a second portion extended along the data line,
wherein the first portion has an expansion, and the expansion of the first portion overlaps with the contact hole.

* * * * *